(12) United States Patent
Shufflebotham et al.

(10) Patent No.: US 6,888,040 B1
(45) Date of Patent: May 3, 2005

(54) METHOD AND APPARATUS FOR ABATEMENT OF REACTION PRODUCTS FROM A VACUUM PROCESSING CHAMBER

(75) Inventors: Paul Kevin Shufflebotham, San Jose, CA (US); Michael Barnes, San Francisco, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 08/671,684

(22) Filed: Jun. 28, 1996

(51) Int. Cl.[7] .............................................. B01D 53/70
(52) U.S. Cl. ........................ 588/212; 588/206; 588/210; 423/240 R; 423/240 S; 95/131; 95/233
(58) Field of Search ................................ 588/206, 210, 588/212, 205, 207, 208, 209, 213, 219, 222, 223; 423/240 R, 240 S; 95/131, 233; 204/155, 157.15, 164

(56) References Cited

U.S. PATENT DOCUMENTS

| | | | |
|---|---|---|---|
| 4,340,462 A | | 7/1982 | Koch .......................... 204/298 |
| 4,937,065 A | * | 6/1990 | Maurer et al. ............... 423/659 |
| 4,948,458 A | | 8/1990 | Ogle ........................... 156/643 |
| 4,977,352 A | * | 12/1990 | Williamson ............. 315/111.81 |
| 5,116,585 A | * | 5/1992 | Schoubye .................... 423/235 |
| 5,187,344 A | * | 2/1993 | Mizuno et al. .............. 588/206 |
| 5,200,232 A | | 4/1993 | Tappan et al. .............. 427/569 |
| 5,354,962 A | * | 10/1994 | Mizuno et al. .............. 588/205 |
| 5,439,568 A | * | 8/1995 | Uchiyama .................... 588/210 |
| 5,569,810 A | * | 10/1996 | Tsuji .......................... 588/227 |
| 5,663,476 A | * | 9/1997 | Cripe et al. .................. 422/170 |
| 5,680,014 A | * | 10/1997 | Miyamoto et al. ....... 315/111.41 |
| 5,693,147 A | * | 12/1997 | Ward et al. ................... 134/1.1 |
| 5,811,631 A | * | 9/1998 | Cripe et al. .................. 422/211 |
| 5,817,284 A | * | 10/1998 | Nakano et al. .......... 423/240 S |
| 6,187,072 B1 | * | 2/2001 | Cheung et al. .............. 422/168 |
| 6,194,628 B1 | * | 2/2001 | Pang et al. ................... 118/722 |
| 6,264,812 B1 | * | 7/2001 | Raaijmakers et al. .. 204/298.06 |
| 6,322,756 B1 | * | 11/2001 | Arno et al. ................... 422/171 |
| 6,384,292 B1 | * | 5/2002 | Cripe et al. .................. 423/210 |
| 6,517,913 B1 | * | 2/2003 | Cheung et al. .............. 427/588 |
| 2002/0020691 A1 | * | 2/2002 | Jewett et al. ........... 219/121.59 |
| 2002/0066535 A1 | * | 6/2002 | Brown et al. ........... 156/345.29 |

FOREIGN PATENT DOCUMENTS

| | | | | |
|---|---|---|---|---|
| DE | 4319118 A | * | 12/1994 | |
| DE | 4319118 A1 | * | 12/1994 | ............ A62D/3/00 |
| EP | 602510 A1 | * | 6/1994 | ............ A62D/3/00 |
| JP | 2-160668 | * | 3/1990 | ................. 588/210 |
| JP | 04279179 | * | 5/1992 | |
| JP | 4-279128 | * | 10/1992 | ................. 588/210 |
| JP | 04279178 A | * | 10/1992 | ............ A62D/3/00 |
| JP | 04279178 | * | 10/1992 | |
| JP | 04279179 A | * | 10/1992 | ............ A62D/3/00 |

* cited by examiner

*Primary Examiner*—Stanley S. Silverman
*Assistant Examiner*—Peter J Lish
(74) *Attorney, Agent, or Firm*—Burns, Doane, Swecker & Mathis LLP

(57) ABSTRACT

An exemplary method and apparatus for abating reaction products from a vacuum processing chamber includes a reaction chamber in fluid communication with the vacuum processing chamber, a coil disposed about the reaction chamber, and a power source for supplying RF energy to the coil. The coil creates a plasma in the reaction chamber which effectively breaks down stable reaction products from the vacuum processing chamber such as perfluorocarbons (PFCs) and hydrofluorocarbons (HFCs) which significantly contribute to global warming. According to alternative embodiments, the plasma may be generated with grids or coils disposed in the reaction chamber perpendicular to the flow of reaction products from the vacuum processing chamber.

29 Claims, 4 Drawing Sheets

US 6,888,040 B1

METHOD AND APPARATUS FOR ABATEMENT OF REACTION PRODUCTS FROM A VACUUM PROCESSING CHAMBER

FIELD OF THE INVENTION

The present invention relates generally to vacuum processing chambers and more particularly to a method and apparatus for abatement of reaction products such as perfluorocarbons and hydrofluorocarbons in vacuum processing chambers.

BACKGROUND OF THE INVENTION

Various types of equipment exist for semiconductor processing such as plasma etching, ion implantation, sputtering, rapid thermal processing (RTP), photolithography, chemical vapor deposition (CVD), and flat panel display fabrication processes wherein etching, resist stripping, passivation, deposition, and the like, are carried out. For example, a vacuum processing chamber may be used for etching and chemical vapor deposition of materials on substrates by supplying an etching or deposition gas to the vacuum chamber and by application of radio frequency (RF) energy to the gas. Electromagnetic coupling of RF energy into the source region of a vacuum chamber is conventionally employed to generate and maintain a high electron density plasma having a low particle energy. Generally, plasmas may be produced from a low-pressure process gas by inducing an electron flow which ionizes individual gas molecules through the transfer of kinetic energy through individual electron-gas molecule collisions. Most commonly, the electrons are accelerated in an electric field, typically a radiofrequency electric field produced between a pair of opposed electrodes which are oriented parallel to the wafer.

Plasma generation is used in a variety of such semiconductor fabrication processes. Plasma generating equipment includes parallel plate reactors such as the type disclosed in commonly owned U.S. Pat. No. 4,340,462, electron cyclotron resonance (ECR) systems such as the type disclosed in commonly owned U.S. Pat. No. 5,200,232, and inductively coupled plasma (ICP) or transformer coupled plasma systems such as the type disclosed in commonly owned U.S. Pat. No. 4,948,458.

Due to the tremendous growth in integrated circuit production, the use of vacuum processing chambers has increased dramatically in recent years. The use of vacuum processing chambers may seriously affect the environment, however, because perfluorocarbons (PFCs) are widely used in plasma etch and plasma-enhanced CVD equipment. PFCs are highly stable compounds which makes them well suited for plasma processing. However, PFCs also significantly contribute to global warming and are not destroyed by scrubbers or other conventional emission control equipment used in vacuum processing chambers. Although there are many gasses which cause global warming, PFCs and hydrofluorocarbons (HFCs), both of which are referred to hereinafter as "fluorocarbons", also used in plasma processing, have particularly high global warming potentials (GWPs). For example, $CF_4$, $C_3F_8$, $SF_6$, $NF_3$, and $C_2HF_5$ all have GWPs of over 3000, and $C_2F_6$, $SF_6$, and $CHF_3$ have GWPs of over 12,000. By contrast, carbon dioxide, a well-known greenhouse gas, has a GWP of 1. In addition, because of their stability, PFCs have a very long lifetime. For example, the lifetimes of $CF_4$ and $C_2F_6$ are 50,000 and 10,000 years, respectively. Thus, collectively, these process gasses can have a significant impact on the environment.

To reduce the impact of PFCs on the environment, several conventional methods for abating PFCs from vacuum processing chambers have been proposed, including process optimization, chemical alternatives, and destruction/decomposition. Process optimization involves the refinement of system parameters to achieve the desired process while using the minimum amount of PFCs. Process optimization is desirable because it reduces chemical costs and emissions and may increase throughput and prolong the life of internal components of the reactor. However, process optimization does not provide a complete solution since it does not involve the abatement of PFCs once they are used in the system. Thus, although the amount of PFCs used is reduced by process optimization, the PFCs that are used are ultimately emitted into the environment.

Chemical alternatives to using PFCs are desirable because they eliminate the problem of PFC emissions entirely. However, to date, research is still underway to uncover more effective and environmentally sound chemical alternatives.

There are two basic categories for conventional destruction/decomposition techniques. The first category involves abatement performed on the atmospheric side of the system, either at each tool or on a large scale for multiple tools, after the gasses have passed through the pumping system. On the atmospheric side, there are several possibilities, including water scrubbers, resin beds, furnaces, flame-based burn boxes, and plasma torches. All of these except burn boxes and torches are ineffective against many of the highly stable PFC compounds.

Burn boxes have been shown to be inefficient abatement devices, unless very large amounts of reactant gases such as hydrogen, methane, or natural gas are flowed through the burn box. This makes these devices very expensive to operate, and environmentally unfriendly.

Plasma torches on the atmospheric side could be more effective; however, very large and expensive, not to mention dangerous, torch facilities would be required to abate what would be a small concentration of PFCs in a very high flow of tool effluent. This inefficiency is exacerbated by the addition of large amounts of nitrogen, used as a diluent in vacuum pumps and as a purge gas in many tool operations.

The second general category of destruction/decomposition techniques involves abatement performed under a vacuum upstream of the pumping system. Plasma destruction is one method, for example, in which a device is employed to treat the exhaust from the tool upstream of the pump before nitrogen purge dilution has taken place. In plasma destruction, energy is applied to the reaction gasses to create a plasma in which the gasses are ionized. The PFCs become unstable at the high energy state, and are consequently broken down into smaller molecules which are less detrimental to the environment.

Examples of devices for plasma destruction include the ETC Dryscrub and the Eastern Digital Post-Reaction Chamber (PRC). The ETC Dryscrub is a flat spiral chamber. The gases come in at the outer end of the spiral, circle around, and eventually exit through the center of the spiral. The spiral is an RF electrode operated at 100 kHz. The purpose of the reactor is to dissociate exhaust gases coming from a CVD system so that any remaining solid-producing gases are reacted onto the walls of the spiral. Tests performed on the ETC Dryscrub reactor, however, resulted in a relatively ineffective abatement of $C_2F_6$, the test gas. In addition, the main reaction product was another greenhouse PFC gas, $CF_4$, and most of the secondary products were also greenhouse gasses. The Eastern Digital PRC is essentially the same as the ETC Dryscrub, and yields similar results. These devices are both inefficient at plasma abatement and have low plasma densities and dissociation rates.

Another known method for plasma destruction, in which $CF_4$, $C_2F_6$, and $SF_6$ may be abated, involves the use of a microwave plasma reactor. Microwave sources, however, are expensive and complex. They also have small skin depths, so they tend have an axial region where there is no plasma, through which unabated gases escape. This can be compensated by inserting a "plug", but the plug then reduces the fluid conductance of the device, which in turn adversely affects the performance of the pumping system.

SUMMARY OF THE INVENTION

According to an exemplary embodiment of the invention, an apparatus for abating fluorocarbons in gas reaction products from a vacuum processing chamber comprises a dielectric tube in fluid communication with an outlet port of the vacuum processing chamber, a coil disposed around the dielectric tube, and an RF source, connected to the coil, for supplying RF energy to the coil and destroying fluorocarbons in the gas.

By applying RF power to the coil, an inductively coupled plasma (ICP) is generated in the dielectric tube which breaks down the reaction products from the vacuum processing chamber. The abatement device provides several advantages over prior systems. For example, in contrast to many prior designs, the abatement device can be made to be simple, compact, inexpensive, efficient, reliable, and require little or no operator or control system intervention. The abatement device also provides a high plasma density, high dissociation rate operation, and a skin depth which is adjustable through the frequency. This results in efficient abatement without compromising foreline conductance.

According to alternative embodiments, the plasma may be generated with grids or coils disposed in the reaction chamber perpendicular to the flow of reaction products from the vacuum processing chamber.

BRIEF DESCRIPTION OF THE DRAWINGS

The foregoing and other objects, features and advantages of the present invention will be more readily understood upon reading the following detailed description in conjunction with the drawings in which.

DETAILED DESCRIPTION OF THE PREFERRED EMBODIMENTS

Figure 1:
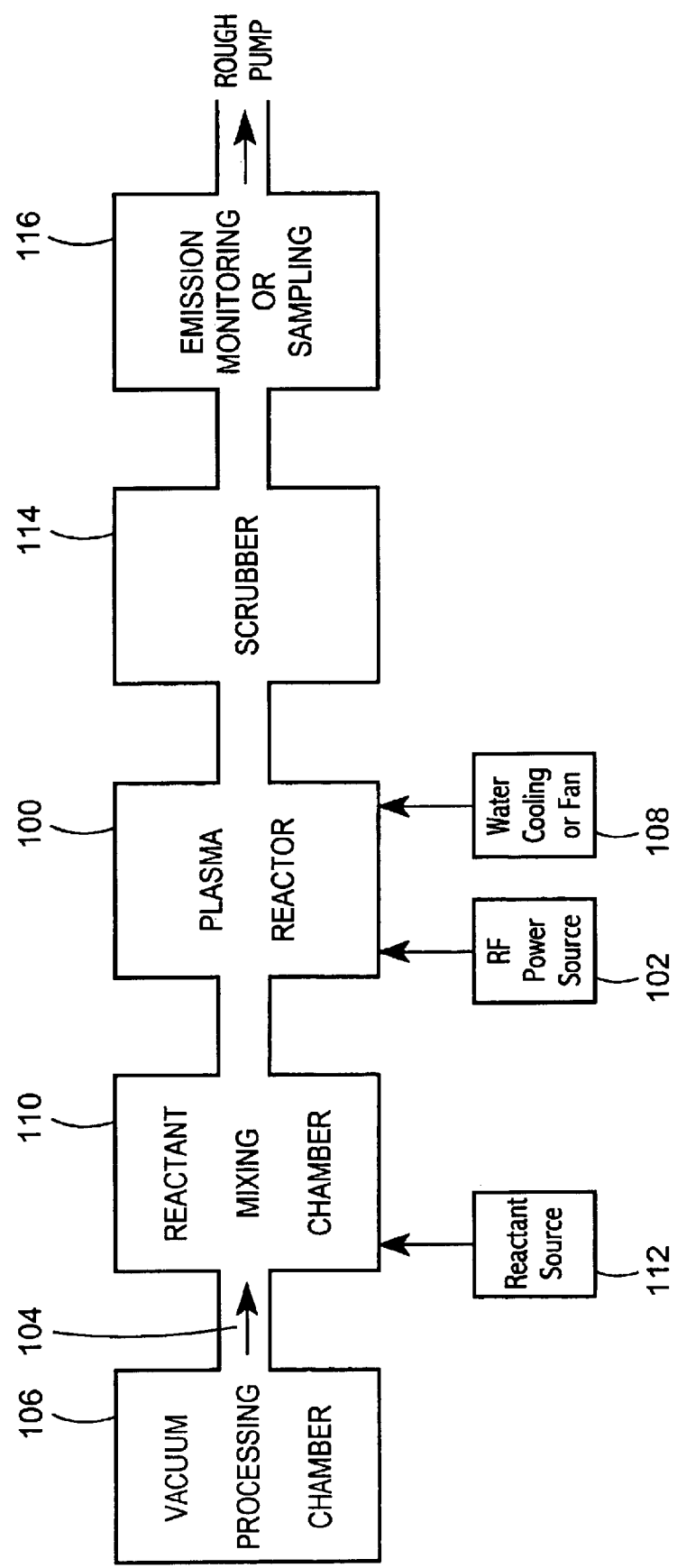
FIG. 1 is an illustration of an abatement apparatus according to an exemplary embodiment of the invention.

Referring to FIG. 1, a fluorocarbon (e.g. perfluorocarbon and/or hydrofluorocarbon) abatement apparatus according to an exemplary embodiment of the invention generally comprises a plasma reactor 100 which includes an RF power source 102 for supplying power to the plasma reactor 100. The abatement apparatus is preferably installed in the foreline 104 of each vacuum processing chamber at the point of use. According to a preferred embodiment, the abatement apparatus comprises a section of dielectric tubing replacing a section of foreline. The abatement apparatus shown in FIG. 1 may thus be installed downstream of a vacuum processing chamber 106. According to a preferred embodiment, a coil wrapped around the dielectric tube is driven with RF power in order to generate an inductively coupled plasma (ICP) within the foreline. The plasma breaks down reaction products from the vacuum processing chamber such as PFCs and HFCs.

The plasma reactor 100 preferably includes a cooling mechanism 108, such as a water cooler or a fan, for dissipating heat created by the plasma in the plasma reactor 100. For example, the plasma reactor 100 may include a water jacket in which water is circulated to absorb heat in the plasma reactor 100, or a fan.

The abatement apparatus may also include a reactant mixing chamber 110 upstream of the plasma reactor 100 for mixing a reactant into the gas flow before it reaches the plasma reactor 100. The reactant mixing chamber 110 is supplied with the reactant by a reactant source 112. According to a preferred embodiment, water vapor is used as the reactant to supply hydrogen and oxygen to the reaction. The reactant may also include a compound such as $H_2$, $CH_4$, or other hydride to supply hydrogen to the reaction, and $O_2$ to supply oxygen to the reaction.

A scrubber 114 can be installed downstream of the plasma reactor 100 to remove HF to prevent damage of the remaining foreline and/or mechanical pump by HF which is a highly corrosive gas. The scrubber 114 may include a material such as Si or W in the form of pellets, beads, chunks, lines, baffles, screens, etc., which reacts with HF. Downstream of the scrubber, an emission monitoring or sampling unit 116 may be provided to monitor the content of the effluent gasses.

Figure 2:
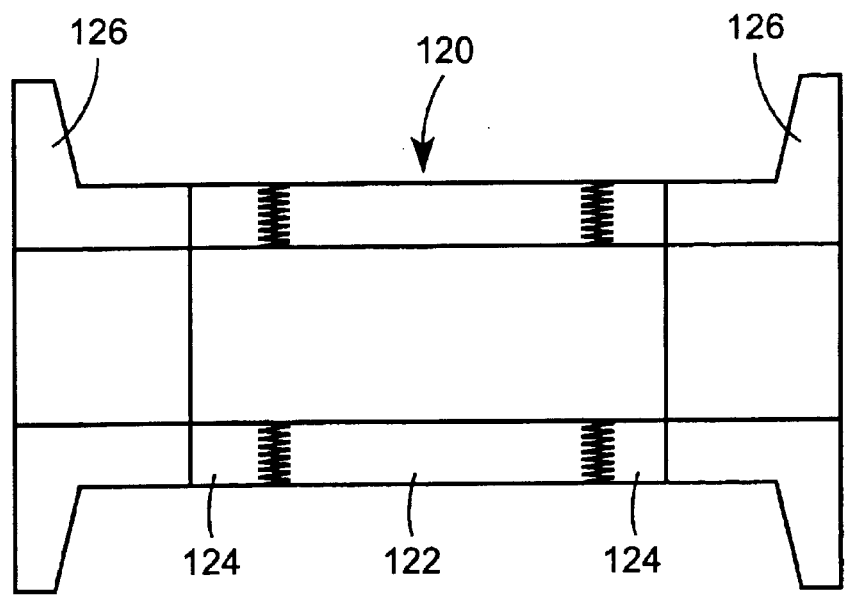
FIG. 2 is an illustration of one embodiment of a reactor tube.
Figure 3:
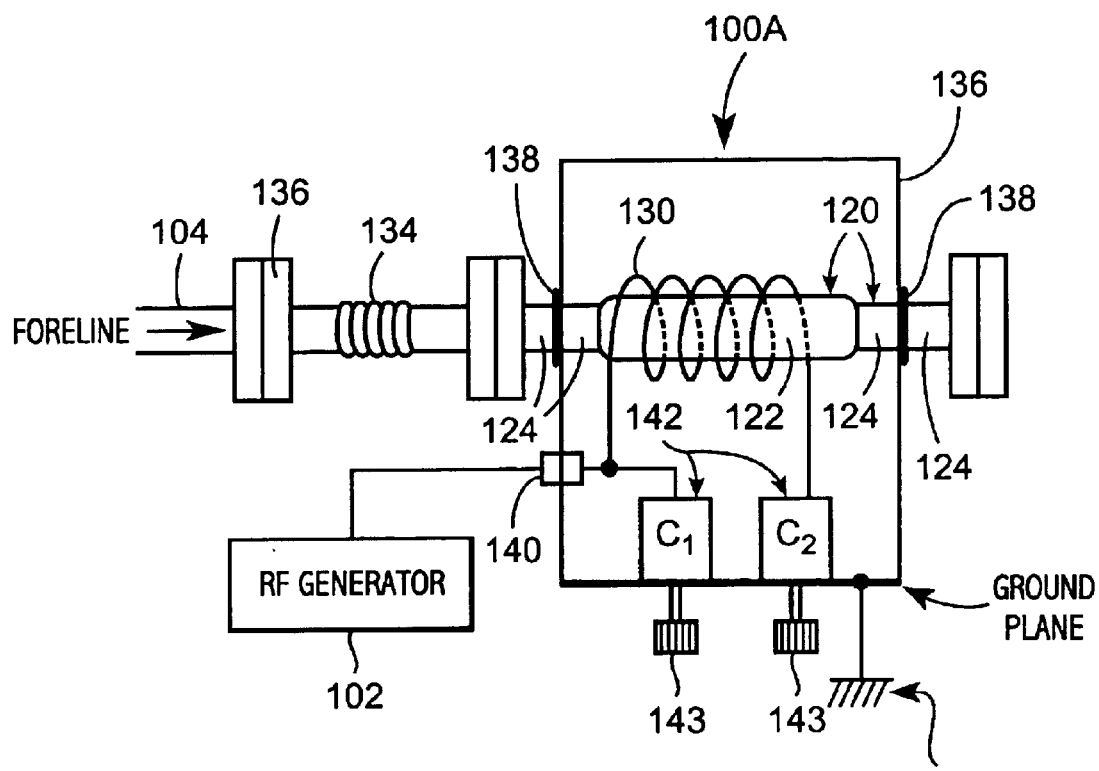
FIG. 3 is an illustration of one embodiment of the plasma reactor of FIG. 1 which includes the reactor tube of FIG. 2.

FIGS. 2 and 3 are illustrations of a plasma reactor 100A according to a preferred embodiment of the invention. The plasma reactor 100A may generally comprise a dielectric tube 120 through which reaction products from the vacuum processing chamber 106 flow. The dielectric tube 120 is preferably divided into three sections, as shown in FIG. 2. The middle section 122 preferably comprises quartz because of its ability to withstand high temperatures. Two end sections 124, which are preferably made of glass, are sealed to the quartz tube 122. The glass end sections 124 are also sealed to a metal foreline tube 126, which can be a standard ISO NW50 flange. The glass end sections 124 are provided because it is difficult to bond quartz directly to metal.

According to one embodiment, the tube shown in FIG. 2 is about 13 inches long from flange to flange with an inner diameter of about 2 inches and an outer flange diameter of about 3 inches. The quartz section 122 may be about 10 inches long and the two glass sections 124 may each be 2 inches long. These dimensions are of course provided only as an example and are not intended to be limiting.

As shown in FIG. 3, a coil 130 is provided to generate a high density plasma source which efficiently abates PFCs and other products from the vacuum processing chamber 106. The coil 130 preferably encircles the inner quartz section 122 but not the glass end sections 124 so that the glass end sections 124 remain at a lower temperature.

FIG. 3 shows the exemplary plasma reactor 100A implemented as part of a vacuum processing apparatus. The foreline 104 of the apparatus is at low pressure and contains reaction products from the vacuum processing chamber. The pressure inside the dielectric tube may range from about 30 mTorr to 3 Torr, for example, and preferably is about 200 mTorr.

A bellows 134 may be provided between the foreline 104 and the plasma reactor 100 and may be attached to the foreline 104 with a flange 136. The bellows 134 provides strain relief to the dielectric tube 120 of the plasma reactor 100A. Thus, any strain caused by movement of the foreline 104 with respect to the plasma reactor 100A may be alleviated with the flexible bellows 134 so that the dielectric tube 120 of the plasma reactor 100A is not damaged. The dielectric tube 120 can be further protected by securely attaching it to the rigid enclosure 136 in which it is located. The walls of the rigid enclosure 136, which may be metal and which are fixed to the dielectric tube 120, provide additional resistance to strains imparted on the dielectric tube 120 by movement of the foreline 104.

The apparatus may also include an RF shielding seal 138 at the junction between the reactor tube 120 and the rigid enclosure 136 in which the reactor tube 120 is located. The RF shielding seal 138 prevents RF radiation generated by the coil 130 from interfering with nearby electronic devices. An RF feed through connector 140 may be installed on the enclosure 136 to transmit RF power to the interior of the enclosure 136.

Figure 4:
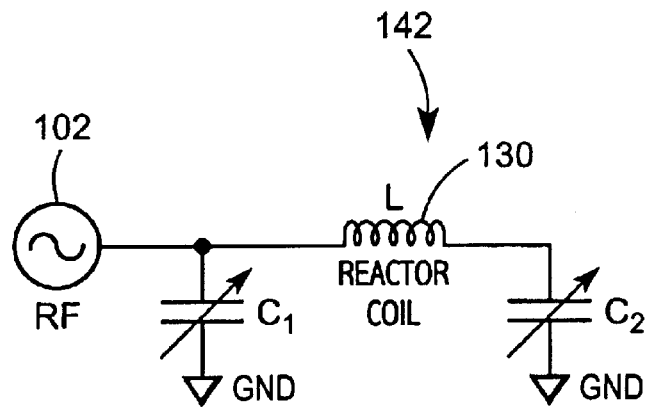
FIG. 4 is an illustration of the exemplary matching network of FIG. 3.

To control the power applied through the coil 130 and to adjust the resonant frequency of the coil 130, a matching network 142 can be provided. The matching network 142 is preferably simple and inexpensive. As shown in FIGS. 3 and 4, the matching network 142 may include a first variable capacitor $C_1$ connected at one side to ground and at the other side to the RF power source 102 and to one end of the coil 130. A second variable capacitor $C_2$ may be connected between ground and the other end of the coil 130. The capacitance of the variable capacitors $C_1$ and $C_2$ may be adjusted in any suitable manner, such as with knobs 143, to adjust the circuit resonance frequency with the frequency output of the RF generator 102 and to cancel the inductive reactance of the coil 130. Impedance matching maximizes the efficiency of power transfer to the coil 130. Those skilled in the art will recognize that other types of matching networks 142 can be used in conjunction with the present invention.

When the coil 130 is powered by the power source 102, two examples of the chemical reactions of two PFCs, $C_2F_6$ and $SF_6$ are as follows:

EXAMPLE 1

$$C_2F_6 \longrightarrow CF_3 + CF_3$$

$$O_2 \longrightarrow O + O$$

$$COF_2 \longrightarrow COF + F$$

$$CO_2 \longrightarrow CO + O$$

$$F_2 \longrightarrow F + F$$

$$COF + O \longrightarrow CO_2 + F$$

$$CF_3 + O \longrightarrow COF_2 + F$$

$$CF_3 + CF_3 + M \longrightarrow C_2F_6 + M$$

$$O + O + M \longrightarrow O_2 + M$$

$$COF + F + M \longrightarrow COF_2 + M$$

$$CO + O + M \longrightarrow CO_2 + M$$

$$F + F + M \longrightarrow F_2 + M$$

$$CO + F + M \longrightarrow COF + M$$

EXAMPLE 2

$$SF_6 + O_2 \longrightarrow SO_2 + 3F_2$$

$$SF_6 + O_2 \longrightarrow SO_2F_2 + 2F_2$$

According to one embodiment of the invention, a reactant injector 110 is provided upstream of the plasma reactor, as shown in FIG. 1. The reactant injector 110 delivers chemicals with which to react away the PFC compounds, which otherwise could simply recombine downstream of the plasma reactor. The preferred embodiment is a water vapor injector. The hydrogen from the water reacts with the fluorines of the PFCs to produce HF. The HF may then be removed either by the scrubber chamber 114 upstream of the pump or by a conventional scrubber on the atmospheric side. The oxygen reacts with carbon, sulphur and/or nitrogen to produce COx, SOx and NOx, which are less harmful global warning gases than PFCs, and which may be removed from the emission stream by scrubbers. Various hydrides may also be produced and removed by scrubbing, as well as polymers and inorganic solids which will deposit on the reactor walls. The reactor, therefore, is preferably designed to be easy to clean or replace. Water vapor is preferred as the reactant because it is much less expensive than the reactants $H_2$, $CH_4$ or other hydrides and $O_2$ commonly used in abatement systems to supply hydrogen and oxygen to the reaction. The flowrate of the total reactant (e.g. water vapor, $H_2$, $CH_4$ and/or $O_2$) supplied by the reactant source 112 may be approximately equal to the flowrate of the process gasses from the vacuum processing chamber, for example 50–1000 cubic centimeters at standard temperature and pressure per minute. The reactant or reactants are preferably supplied in an amount effective for minimizing recombination of the dissociated PFC's.

Figure 7:
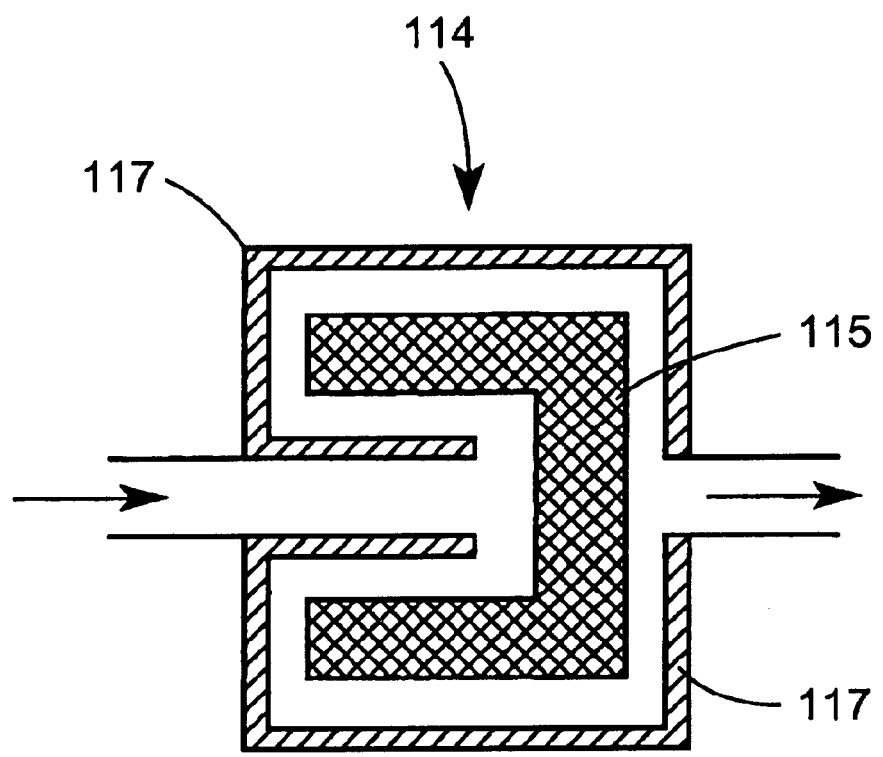
FIG. 7 is an illustration of an exemplary scrubber shown in FIG. 1.

Downstream of the plasma reactor 100 may be a scrubber chamber 114 or section of foreline which contains materials that react with the HF, such as Si or W in the form of pellets, beads, chunks, liners, baffles, screens, etc., as shown in FIGS. 1 and 7. In FIG. 7, the scrubber chamber 114 includes an inner section 115 of porous HF reactive materials such as Si or W in the form of mesh, gravel, etc. The scrubber chamber 114 also includes an outer wall 117 which comprises HF reactive material. The provision of such a chamber 114 reduces the likelihood of damage of the remaining foreline and/or mechanical pump by HF, which is a highly corrosive gas. Although HF is easily handled by a scrubber on the atmospheric side, the lifetime of the vacuum plumbing and pumps can be increased significantly by providing a scrubber chamber 114 upstream of the vacuum plumbing and pumps.

Figure 5:
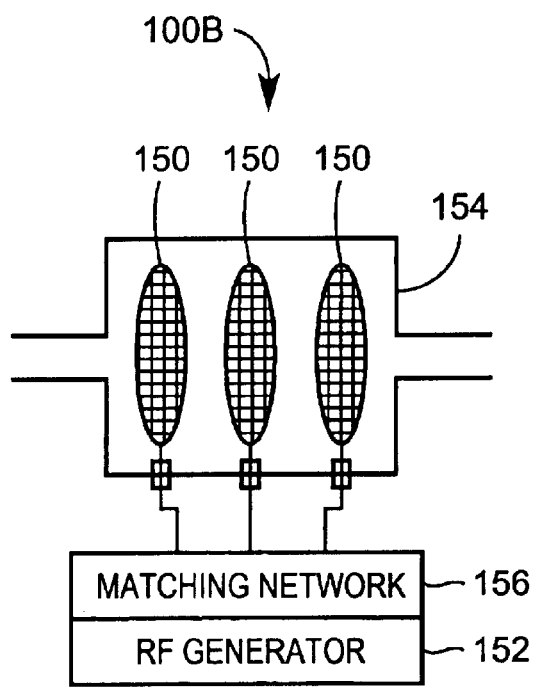
FIG. 5 is an illustration of another embodiment of the plasma reactor of FIG. 1.

According to another embodiment of the invention, the plasma reactor may comprise conductive elements inside the foreline to generate a plasma. As shown in FIG. 5, the elements of the plasma reactor 100B may be in the form of conductive grids 150 through which the gases flow. Adjacent grids 150 are oppositely charged with an RF generator 152 to generate a capacitive plasma. The reaction products, e.g., PFCs, are unstable in the high energy plasma, and are consequently reacted into smaller, less harmful molecules as described above. The grids 150 are preferably planar with the plane of the grid oriented perpendicular to the flow of reaction products from the vacuum processing chamber. To generate a capacitive plasma, at least two grids 150 are used. To further enhance the effectiveness of the plasma reactor, additional grids 150 can be provided. The additional grids alternate in polarity so that each adjacent pair of grids 150 acts as a capacitor. The grids 150 may comprise a plasma resistant material for a long lifetime. Alternatively, the grids may comprise a consumable material or materials for enhanced abatement capacity.

The grids 150 are preferably disposed in a chamber 154 which has a larger cross sectional area than the cross sectional area of the foreline. In this way, the fluid conductance of the plasma reactor 100B is not compromised. In addition, a fan or other cooling device can be provided to dissipate heat created by the conductive grids 150. As in the previous embodiment, a matching network 156 can be provided to maximize or control the power delivered to the grids 150.

Figure 6:
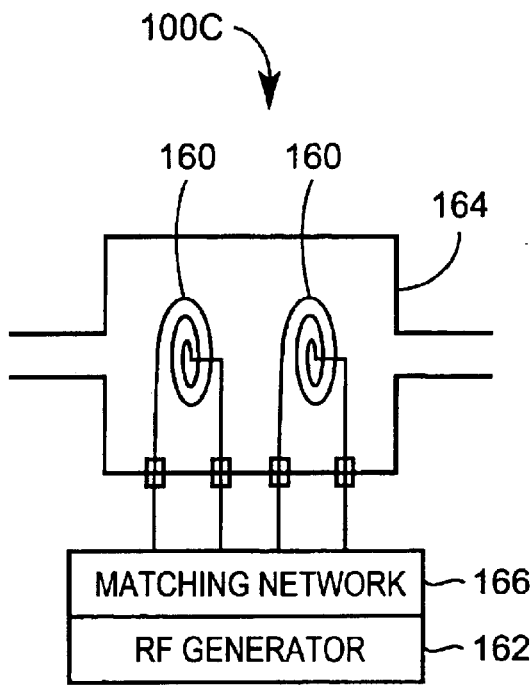
FIG. 6 is an illustration of another embodiment of the plasma reactor of FIG. 1.

According to another embodiment of the invention, an exemplary plasma reactor 100C comprises at least one and preferably two or more transformer coupled plasma coils. The transformer coupled plasma coils 160, as shown in FIG. 6, have a generally spiral, planar configuration and are preferably oriented such that the plane of the coil is perpendicular to the flow of reaction products. The transformer coupled plasma coils 160 are coupled, preferably through a matching network 166, to an RF generator 162. By resonating a radiofrequency current through the coils 160, a planar magnetic field is induced which induces a generally circular flow of electrons within a planar region parallel to the plane of the coil 160. The circulating electrons create a plasma by ionizing individual gas molecules through the transfer of kinetic energy from individual electron-gas molecule collisions.

The reaction products, e.g., PFCs, are unstable in the high energy plasma, and are consequently reacted into smaller molecules as described above. Preferably, at least two coils 160 are provided so that the period of time during which the reaction products are in the plasma state is sufficiently long to effectively break down the reaction products. The provision of additional coils 160 thus increases the size of the region which the plasma occupies so that for a given flowrate, the reaction products are in the plasma state for a longer time. The transformer coupled plasma coils can comprise plasma resistant materials for a long lifetime. Alternatively, the transformer coupled plasma coils can comprise a consumable material or materials for enhanced abatement capacity. So that the fluid conductance of the apparatus is not compromised, the chamber 164 in which the transformer coupled plasma coils 60 are located can have an enlarged cross sectional area perpendicular to the flow. A fan or other cooling mechanism can be provided to dissipate heat generated by the coils 160 of the plasma reactor 100C.

Those skilled in the art will recognize that exemplary embodiments of the present invention provide significant advantages in the abatement of reaction products such as fluorocarbons from a vacuum processing chamber. For example, in contrast to many prior designs, the reactor can be made to be simple, compact, inexpensive, efficient, reliable, and require little or no operator or control system intervention. The plasma reactor also provides a high plasma density, high dissociation rate operation, and a skin depth which is adjustable through the frequency. This results in efficient abatement without compromising foreline conductance. Also, in the event that an abatement device fails, only one tool is affected, rather than an entire section of a processing system.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What is claimed is:

1. An abatement method for destroying fluorocarbons consisting essentially of gaseous fluorocarbons exhausted from a vacuum processing chamber in which a semiconductor substrate is processed, the method comprising the steps of:

processing the semiconductor substrate in the vacuum processing chamber thereby producing gaseous reaction products including the gaseous fluorocarbons;

flowing an exhaust gas containing fluorocarbons consisting essentially of the gaseous fluorocarbons from the vacuum processing chamber through a reaction chamber downstream of the vacuum processing chamber;

introducing water vapor as a reactant into the exhaust gas proximate to the vacuum processing chamber in an amount effective to minimize recombination of dissociated fluorocarbons, hydrogen from the water vapor reacting with the dissociated fluorocarbons so as to form HF, and oxygen from the water vapor reacting with at least one of C, S and N in the exhaust gas to form at least one of the gases COx, SOx, and NOx, or a mixture thereof in gaseous form; and applying RF Power to the gas in the reaction chamber to generate a plasma in the reaction chamber which dissociates the fluorocarbons in the exhaust gas.

2. The method of claim 1, wherein the pressure in the reaction chamber is less than atmospheric pressure.

3. The method of claim 1, wherein the water vapor is injected as the reactant into the flow of gas upstream of the reaction chamber.

4. The method of claim 1, further comprising the step of controlling the amount of RF power applied to the fluorocarbons with a matching network.

5. The method of claim 1 wherein the vacuum processing chamber comprises a high density plasma reactor and the exhaust gas is produced while etching a semiconductor substrate.

6. The method of claim 1, wherein the vacuum processing chamber comprises a high density plasma reactor and the exhaust gas is produced during chemical vapor deposition of a material on a semiconductor substrate.

7. The method of claim 1, wherein the exhaust gas has a flow rate equal to a flow rate of process gases exhausted from the vacuum processing chamber.

8. The method of claim 1, wherein the exhaust gas flows continuously through the reaction chamber during the step of applying RF power to the gas in the reaction chamber.

9. The method of claim 1, wherein the HF is removed from the exhaust gas by a scrubber downstream from the reaction chamber.

10. The method of claim 1, wherein the reactant and the exhaust gas flow through the reaction chamber at flow rates of 50 to 1000 sccm.

11. The method of claim 1, wherein the reactant and the exhaust gas flow through the reaction chamber at approximately equal flow rates.

12. The method of claim 1, wherein the RF power is applied to the gas in the reaction chamber with a plurality of conductive elements arranged within the reaction chamber.

13. The method of claim 12, wherein the conductive elements comprise coils.

14. The method of claim 12, wherein the conductive elements comprise grids.

15. The method of claim 1, further comprising reacting gas exhausted from the reaction chamber with a scrubber comprising at least one of Si and W in the form of at least one of beads, pellets, chunks, a liner, a baffle, a screen and a grid.

16. The method of claim 1, wherein the introduction of water vapor as a reactant into the exhaust gas proximate to the plasma processing chamber comprises introducing vapor into a foreline of the vacuum processing chamber.

17. The method of claim 1, wherein generating a plasma in the reaction chamber by applying RF power to the gas comprises applying RF power to at least one transformer coupled plasma (TCP) coil to induce a planar magnetic field which induces a flow of electrons within a planar region parallel to the plane of the at least one TCP coil, wherein the flow of electrons creates a plasma by ionizing gas molecules.

18. An abatement method for destroying fluorocarbons consisting essentially of gaseous fluorocarbons exhausted from a vacuum processing chamber in which a semiconductor substrate is processed, the method comprising:
processing the semiconductor substrate in the vacuum processing chamber thereby producing gaseous reaction products including the gaseous fluorocarbons;
flowing an exhaust gas containing fluorocarbons consisting essentially of the gaseous fluorocarbons from the vacuum processing chamber through a reaction chamber downstream of the vacuum processing chamber;
introducing water vapor as a reactant into the exhaust gas proximate to the vacuum processing chamber in an amount effective to minimize recombination of dissociated fluorocarbons, hydrogen from the water vapor reacting with the dissociated fluorocarbons to form HF, and oxygen from the water vapor reacting with at least one of C, S and N in the exhaust gas to form at least one of the gases COx, SOx, and NOx, or a mixture thereof in gaseous form;
applying RF power to the gas in the reaction chamber to generate a plasma in the reaction chamber which dissociates the fluorocarbons in the exhaust gas; and
reacting gas exhausted from the reaction chamber with at least one of Si and W downstream of the reaction chamber.

19. The method of claim 18, wherein generating a plasma in the reaction chamber by applying RF power to the gas comprises applying RF power to at least one transformer coupled plasma (TCP) coil to induce a planar magnetic field which induces a flow of electrons within a planar region parallel to the plane of the at least one TCP coil, wherein the flow of electrons creates a plasma by ionizing gas molecules.

20. An abatement method for destroying fluorocarbons, consisting essentially of:
processing a semiconductor substrate in a vacuum processing chamber thereby producing gaseous reaction products including gaseous fluorocarbons;
flowing an exhaust gas containing the gaseous reaction products and fluorocarbons from the vacuum processing chamber through a reactant mixing chamber proximate to the vacuum processing chamber and then through a reaction chamber downstream from the reactant mixing chamber, wherein both the reactant mixing chamber and reaction chamber are in flow communication with the vacuum processing chamber;
introducing water vapor into the exhaust gas in the reactant mixing chamber in an amount effective to reduce recombination of dissociated fluorocarbons in the gaseous reaction products, hydrogen from the water vapor reacting with the dissociated fluorocarbons so as to form HF in gaseous form;
generating a plasma in the plasma reactor by applying RF power to the gas in the plasma reactor, the plasma dissociating the fluorocarbons in the exhaust gas; and
optionally removing the HF from the exhaust gas downstream of the plasma reactor.

21. The method of claim 20, wherein the water vapor is injected as the reactant into the exhaust gas in a foreline of the vacuum processing chamber proximate to the vacuum processing chamber.

22. The method of claim 20, wherein generating a plasma in the reaction chamber by applying RF power to the gas comprises applying RF power to at least one transformer coupled plasma (TCP) coil to induce a planar magnetic field which induces a flow of electrons within a planar region parallel to the plane of the at least one TCP coil, wherein the flow of electrons creates a plasma by ionizing gas molecules.

23. An abatement method for destroying fluorocarbons, consisting essentially of:
plasma etching a semiconductor substrate using gaseous fluorocarbons in a vacuum processing chamber thereby producing gaseous etch reaction products including dissociated fluorocarbons;
flowing an exhaust gas containing the remaining gaseous fluorocarbons and the dissociated fluorocarbons from the vacuum processing chamber through a reaction chamber in flow communication with the vacuum processing chamber;
introducing water vapor into the exhaust gas proximate to the vacuum processing chamber and upstream from the reaction chamber upstream from the reaction chamber in an amount effective to reduce recombination of dissociated fluorocarbons dissociated in the vacuum processing chamber, hydrogen from the water vapor reacting with the dissociated fluorocarbons so as to form HF in gaseous form;
generating a plasma in the reaction chamber by applying RF power to the exhaust gas in the reaction chamber, the plasma dissociating the gaseous fluorocarbons in the exhaust gas that were not previously dissociated in the vacuum processing chamber or were recombined upstream from the reaction chamber, wherein the dissociated gaseous fluorocarbons dissociated in the reaction chamber also react with hydrogen from the water vapor so as to form HF in gaseous form; and
removing the HF from the exhaust gas downstream of the reaction chamber.

24. The method of claim 23, wherein the HF is removed by at least one of a Si scrubber and a W scrubber in the form of at least one of beads, pellets, chunks, a liner, a baffle, a screen and a grid.

25. The method of claim 23, wherein generating a plasma in the reaction chamber by applying RF power to the gas comprises applying RF power to at least one transformer coupled plasma (TCP) coil to induce a planar magnetic field which induces a flow of electrons within a planar region parallel to the plane of the at least one TCP coil, wherein the flow of electrons creates a plasma by ionizing gas molecules.

26. A fluorocarbon abatement method, comprising:

processing a semiconductor substrate in a vacuum processing chamber using gaseous fluorocarbons thereby producing gaseous reaction products including dissociated fluorocarbons;

flowing an exhaust gas of the remaining gaseous fluorocarbons and the dissociated fluorocarbons from the vacuum processing chamber through a reaction chamber in flow communication with the vacuum processing chamber;

introducing water vapor into the exhaust gas proximate to the vacuum processing chamber and upstream from the reaction chamber;

generating a plasma in the reaction chamber by applying RF power to the exhaust gas and the water vapor in the reaction chamber, the plasma dissociating the gaseous fluorocarbons in the exhaust gas; and reacting gas exhausted from the reaction chamber with one of Si and W.

27. The method of claim 26, wherein the water vapor is injected as the reactant in a foreline of the vacuum processing chamber proximate to the vacuum processing chamber.

28. The method of claim 26 wherein the gas exhausted from the reaction chamber is reacted with at least one of a Si scrubber and a W scrubber in the form of at least one of beads, pellets, chunks, a liner, a baffle, a screen and a grid.

29. The method of claim 26, wherein generating a plasma in the reaction chamber by applying RF power to the gas comprises applying RF power to at least one transformer coupled plasma (TCP) coil to induce a planar magnetic field which induces a flow of electrons within a planar region parallel to the plane of the at least one TCP coil, wherein the flow of electrons creates a plasma by ionizing gas molecules.

\* \* \* \* \*